United States Patent [19] [11] Patent Number: 5,050,063
Sekiguchi [45] Date of Patent: Sep. 17, 1991

[54] METHOD FOR CONTROLLING THE CHARACTERISTICS OF AN AQUEOUS SOLUTION

[75] Inventor: Naoki Sekiguchi, Shizuoka, Japan
[73] Assignee: Fuji Photo Film Co., Ltd., Kanagawa, Japan
[21] Appl. No.: 387,975
[22] Filed: Aug. 1, 1989
[30] Foreign Application Priority Data
  Aug. 1, 1988 [JP] Japan .................. 63-192246
[51] Int. Cl.⁵ .................................. G05B 13/02
[52] U.S. Cl. ........................ 364/165; 364/472; 164/414
[58] Field of Search ........ 364/164, 165, 166, 500–502, 364/568, 472; 162/252, 253, 262; 164/414

[56] References Cited
U.S. PATENT DOCUMENTS 3,596,071 3/1965 Doering ........................ 364/469
3,767,900 10/1973 Chao et al. ..................... 364/471
3,947,668 3/1976 Al-Shaikh et al. .............. 364/164
3,989,935 11/1976 Fay .............................. 364/165
4,374,703 2/1983 Lebeau et al. ................. 162/253

Primary Examiner—Jerry Smith
Assistant Examiner—Paul Gordon
Attorney, Agent, or Firm—Young & Thompson

[57] ABSTRACT

A method of controlling the characteristics of an aqueous solution for treating the surfaces of a web moving continuously in a lengthwise direction, consists of changing certain characteristics, such as the specific gravity, of the aqueous solution at a fundamental period depending on physical parameters, such as the speed at which the web is driven and/or the width of the web, by feedforward control, and changing that fundamental period in accordance with the difference between the measured characteristics of the aqueous solution and reference characteristics according to which the aqueous solution is to be controlled, by feedback control.

13 Claims, 2 Drawing Sheets

METHOD FOR CONTROLLING THE CHARACTERISTICS OF AN AQUEOUS SOLUTION

BACKGROUND OF THE INVENTION

The present invention relates to a method for controlling the characteristics of an aqueous solution, and more particularly to a method for controlling the characteristics of a liquid mixture used in the surface treatment of a web material such as an aluminum web, a cold-rolled steel web, etc.

A control system combining feedforward and feedback controls is described in a report entitled "A New Combination of Feedforward and Feedback Controls" in the briefing text delivered at the 22nd SICE Science Lecture Meeting, 1983.

This system is shown in FIG. 3 of the accompanying drawings, and comprises a flow meter 11 to meter the rate of fluid flow into a heat exchanger 10 and to provide an appropriate electric signal indicating the detected rate of flow (which is hereinafter referred to as a flow rate signal (FRS)). The rate of flow of vapor or steam at a certain temperature which heats the fluid in the heat exchanger 10 is regulated by a control valve 12. A steam flow control unit 13 changes the opening of the control valve 12 so as to regulate the rate of flow of the steam. A thermometer 14 detects the temperature of the heated fluid discharged from the heat exchanger 10 to provide an appropriate electric signal (which is hereinafter referred to as a temperature signal (TS)). The temperature of the heated fluid detected by the thermometer 14 is compared with a reference temperature previously set by a temperature setting unit 9 in a comparison circuit 15. A feedforward operator 16 calculates an appropriate rate of steam flow based on the result of the comparison of the temperatures in the comparator circuit 15 so as to provide the steam flow controlling unit 13 with a signal either to increase the rate of flow of the steam when the detected temperature is lower than the reference temperature or to decrease it when the detected temperature is higher than the reference temperature. Because the change of the rate of flow of the steam depends upon the change of the amount of heat which the heated fluid has received, a closed loop is formed for feedback control. The feedforward operator 16 receives the flow rate signal FRS from the flow meter 11 and performs an analog calculation based on the flow rate of the heated fluid so as to provide the steam flow control unit 13 with a signal either to increase the flow rate of the steam when the detected flow rate of the heated fluid is low or to decrease it when the detected flow rate of the heated fluid is high.

In the above-described control system, because the feedforward operator 16 performs an analog operation and data for the analog operation is measured before the analog operation is performed, it is hard to perform real-time operations. On the other hand, in a treating apparatus for treating uniformly the whole length of a continuously moving web in the direction in which it is driven, it is unavoidable that the treating vessel or tank containing the liquid mixture or aqueous solution for treating the surfaces of the web will be elongated in the moving direction. This leads to a relatively long delay of time in controlling the treating solution. Therefore, there will necessarily be a lack of stability in controlling the characteristics of aqueous solutions, when a solution is not controlled in real-time based on measured data and there results a relatively long time delay in controlling the treatment solution.

OBJECT OF THE INVENTION

It is, therefore, an object of the present invention to provide a method for quickly controlling the characteristics of an aqueous solution in a surface treatment system for webs, which generally avoids long control delay times.

SUMMARY OF THE INVENTION

To achieve the above object of the present invention, the method for controlling the characteristics of a solution in accordance with the invention consists in changing the characteristics, such as the specific gravity, of an aqueous solution at a basic period depending upon physical parameters, such as the speed at which the web is driven and/or the width of the web, by feedforward control, and changing that basic period in accordance with the difference between the measured characteristics of the aqueous solution and the values of reference parameters as to which the aqueous solution is to be controlled, by feedback control.

When the speed and/or the width of the web is measured, the basic period $T_S$ is determined during which the control of the characteristics of an aqueous solution is effected by, for example, supplying an additive to the aqueous solution. The basic period $T_S$ is increased if the measured characteristic of the controlled aqueous solution is higher than the reference characteristic which is suitably predetermined for the surface treatment of the web, or decreased if the measured characteristic is less than the reference characteristic.

To increase or decrease the basic period $T_S$, a correction or value $T_D$ determined in accordance with the difference between the measured and the reference characteristics is used to obtain a practical control period $T_C$ from the following equation:

$$T_C = T_S - T_D$$

where the correction or value $T_D$ can have a plus or a minus value.

Because the above parameter control is effected periodically, no time delay in controlling the characteristics of the aqueous solution is caused by effecting feedback control between the periodical controls. Accordingly, a stable, quick control of the characteristics of a solution is effected at low cost without the need for a microcomputer or the like even though the web changes in speed or different widths of webs are successively treated.

DETAILED DESCRIPTION OF THE INVENTION

Figure 1:
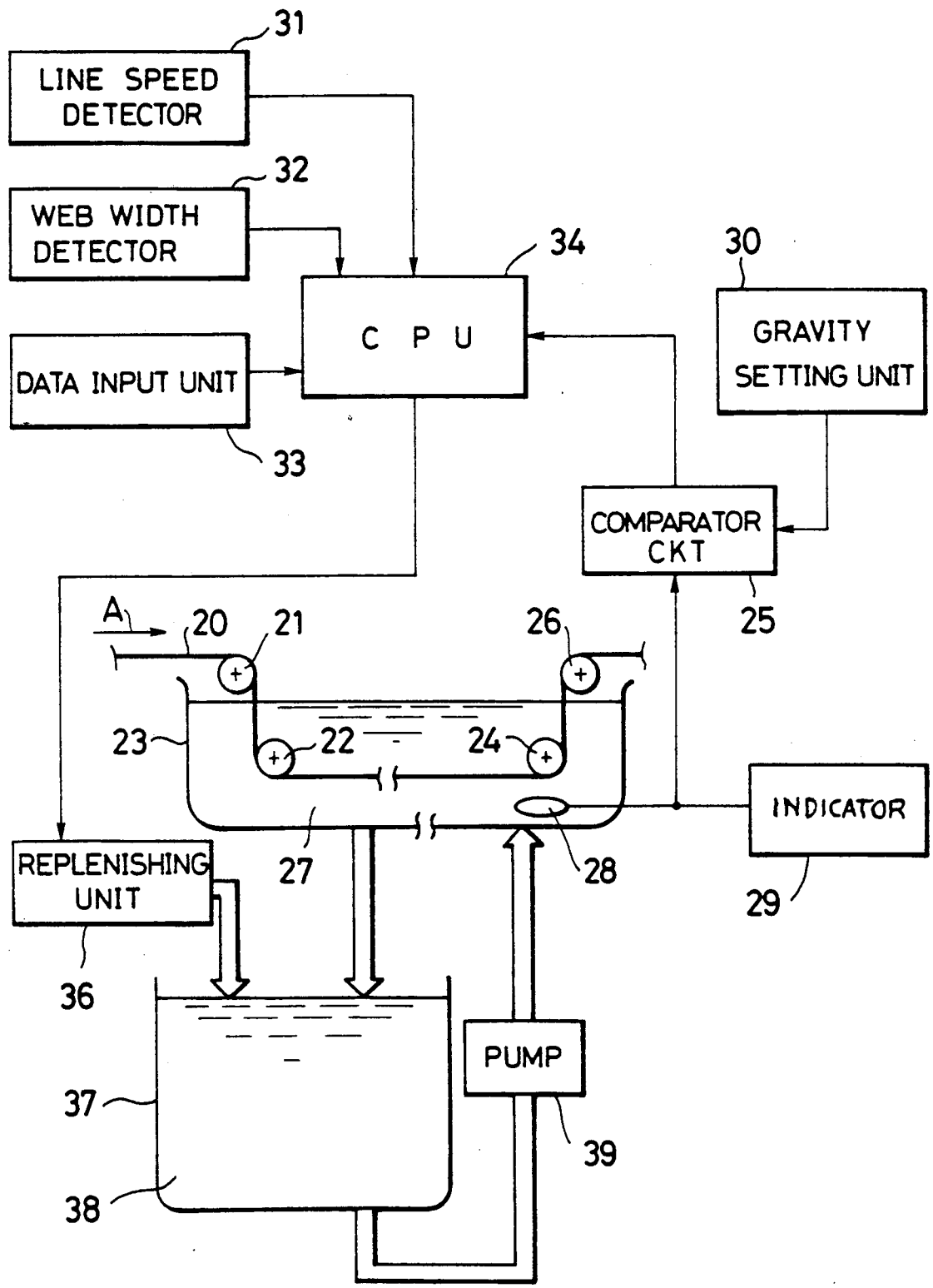
FIG. 1 is a schematic illustration showing an apparatus for practicing a method for controlling the characteristics of aqueous solutions according to the present invention.
Figure 2:
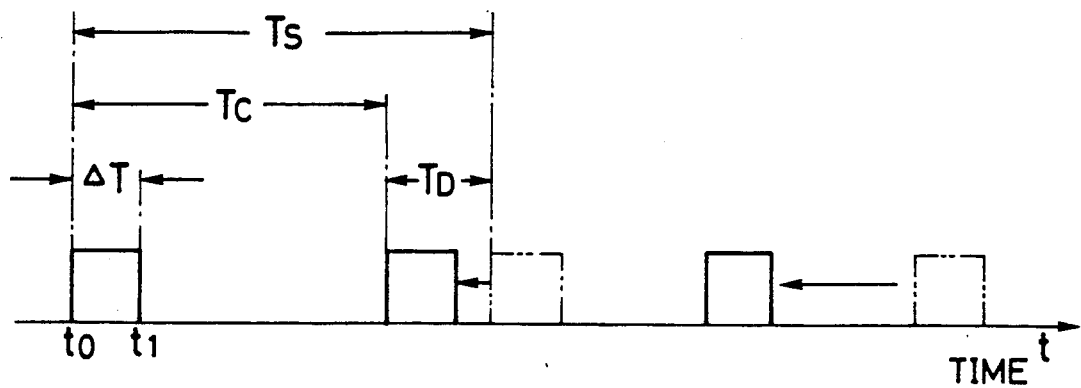
FIG. 2 is a graph showing the period at which an additive is supplied to a solution to be controlled.
Figure 3:
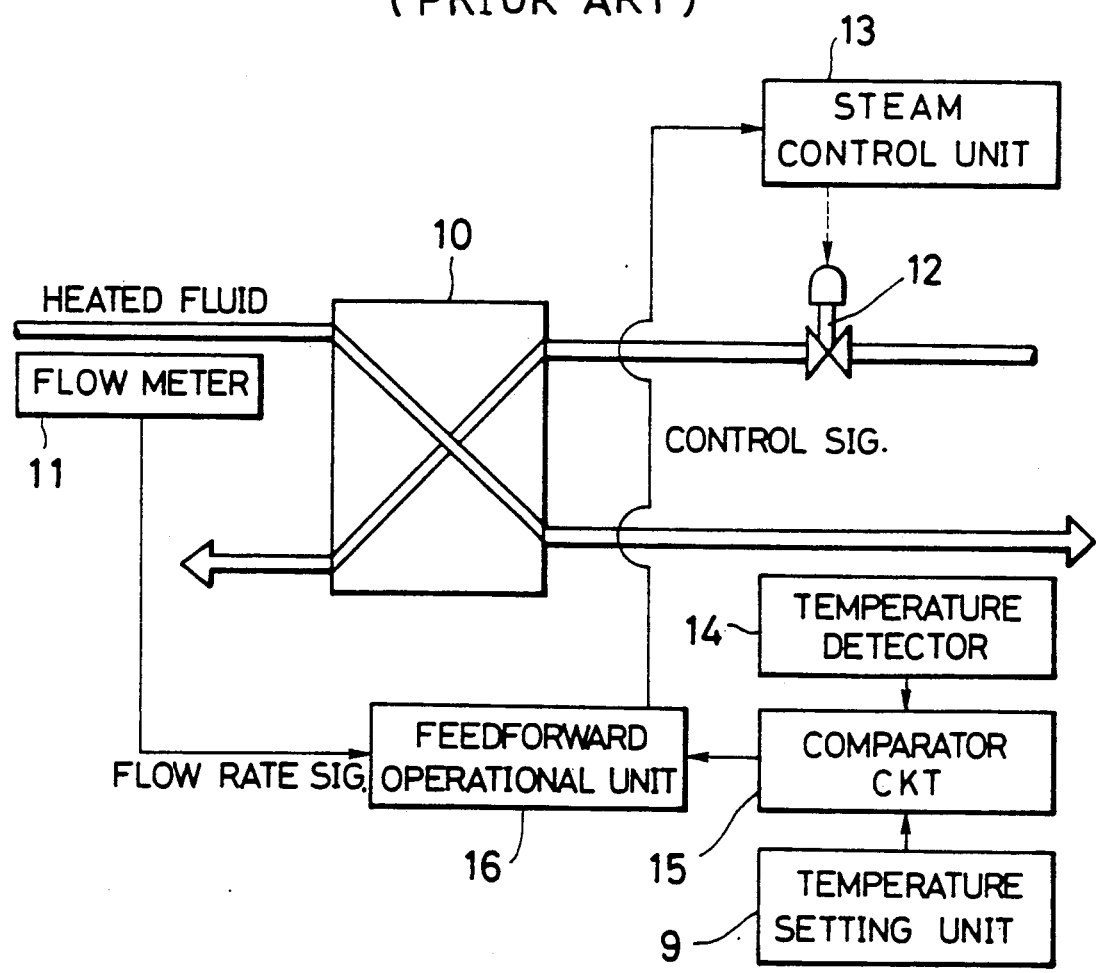
FIG. 3 is a schematic block diagram showing an apparatus for heat exchange in a conventional combination of feedforward and feedback controls.

Referring to the drawings, in particular to FIG. 1, showing a preferred embodiment of the present invention, a web 20 such as a thin metal web travels in a direction shown by an arrow A in FIG. 1 at a constant speed. Two pairs of vertically displaced pass rollers 21,22 and 24, 26 are disposed at opposite ends of a treating vessel or tank 23. The lower pass rollers 22, 24 are immersed in a circulating treatment liquid mixture or solution 27 contained in the processing tank 23 so as to form a run of the metal web 20 partly in the circulating aqueous solution 27. When the metal web 20 passes through the liquid solution, both surfaces of the metal web 20 are treated with the aqueous solution 27 with the occurrence, for example, of a desired chemical reaction.

A specific gravity sensor 28, which is disposed near the bottom of the treating tank 23, continuously monitors the specific gravity of the circulating aqueous solution 27. An indicator 29 displays the specific gravity detected by the specific gravity sensor 28. A comparator circuit 25 compares the detected specific gravity with a reference specific gravity set by a reference specific gravity setting unit 30 and provides a CPU 34 with an output indicating any difference of the two specific gravities.

A line speed detector 31 continuously monitors the metal web 20 to determine its linear speed and outputs an appropriate electric signal (which is hereinafter referred to as a line speed signal (LSS)). A width detector 32 continuously monitors the metal web 20 to determine its width and outputs an appropriate electric signal (which is hereinafter referred to as a width signal (WS)). A data input unit 33 provides a data signal indicating the necessary specific characteristics such as the kind of web 20, etc. These signals are all sent to the CPU 34.

Based on the linear speed, the width and/or other physical parameters of the metal web 20 and the deviation of the specific gravity of the circulating treating solution 27 from the reference specific gravity, the CPU 34 controls the frequency with which pulses are generated thereby.

A replenishing unit 36 adds a predetermined quantity of liquid additive to replenish aqueous solution 38 in a reservoir 37 each time a pulse is applied thereto by the CPU 34. The aqueous solution 38 is thoroughly mixed with the added liquid in a well-known manner. The aqueous solution 38 is pumped into the treating tank 23 by a pump 39. To keep the volume of the circulating aqueous solution 27 in the treating tank 23 constant, the circulating aqueous solution 27 is recirculated from the treating tank 23 at an appropriate rate having regard for the rate of replenishment and the delivery rate of the aqueous solution 38 into the treating tank 23. This recirculation and replenishment can be carried out in any manner well known in the chemical processing art.

The CPU 34 provides a pulse, which pulse has a pulse width $\Delta T$ defined between a time $t_o$ at which the pulse begins and a time $t_1$ at which the pulse ends. The pulse width $\Delta T$ is a measurement of how long the replenishing unit 36 is actuated. The pulse width $\Delta T$ is to be kept constant if the pressure P of the liquid additive is constant and to vary in inverse proportion to the value $P^{\frac{1}{2}}$ if the pressure fluctuates.

The current period $T_C$ at which the control pulse CP is provided is given as follows:

$$T_C = T_S - T_D$$

where
 $T_S$ is a fundamental period; and
 $T_D$ is a compensatory period depending on the detected specific gravity of the circulating aqueous solution 27. These periods $T_C$, $T_S$ and $T_D$ are given by the following equations (1), (2) and (3), respectively:

$$T_S = aW - bV + c \tag{1}$$

$$T_D = d(D - D_s) + e \tag{2}$$

$$T_C = T_S - T_D = aW - bV - d(D - D_s) + c - e \tag{3}$$

where
 W is the width of the metal web;
 V is the detected linear speed of the metal web;
 D is the detected specific gravity of the circulating aqueous solution;
 $D_s$ is the reference specific gravity; and
 a, b, c, d and e are constants according to the properties of the web.

These constants a, b, c, d and e are experimentally obtained and their values are stored in the CPU 34.

If any one of the line speed V and the width W of the web 20 and the web 20 itself (the constants a to d) changes, the fundamental period $T_S$, and accordingly the current period $T_C$ and the compensatory period $T_D$, change according to the equations (1) and (3). That is, if the line speed V intermittently changes while no change of the specific gravity of the circulating aqueous solution 27 takes place, the current period $T_C$ immediately changes correspondingly to the changed fundamental period $T_S$ by feedforward control. By means of this feedforward control, the replenishing unit 36 regulates the rate of flow at which the liquid additive is delivered to the aqueous solution 38. Furthermore, feedback control is realized by a closed loop consisting of the steps of detecting the specific gravity by the specific gravity sensor 28, calculating the deviation of the specific gravity of the circulating aqueous solution from the reference specific gravity, changing the compensatory frequency $T_D$ depending on the calculated deviation of specific gravity, supplying liquid additive to the aqueous solution, and changing the specific gravity of aqueous solution 28, looped in this order. In the combination of the feedforward and feedback controls, the time necessary to adjust or change the characteristics, such as the specific gravity, conductivity or the like, of a circulating aqueous solution, is shortened by lengthening or shortening the period $T_C$ at which the control pulse CP is provided.

Although the present invention has been fully described by way of the preferred embodiment thereof with reference to the accompanying drawings, the possibility of various changes and modifications will be apparent to those skilled in the art. Therefore, unless otherwise these changes and modifications depart from the scope of the present invention, they should be construed as being included therein.

What is claimed is:

1. A method for controlling the characteristics of an aqueous solution for treating the surface of a continuously moving web travelling through said solution, said solution having a property with a detectable value, said method comprising the steps of:
    detecting physical parameters of said moving web;
    effecting a feedforward control to change the value of said property of said solution at a fundamental period of time, said fundamental period depending upon said detected physical parameters of said moving web;

direction shown by an arrow A in FIG. 1 at a constant speed. Two pairs of vertically displaced pass rollers 21,22 and 24, 26 are disposed at opposite ends of a treating vessel or tank 23. The lower pass rollers 22, 24 are immersed in a circulating treatment liquid mixture or solution 27 contained in the processing tank 23 so as to form a run of the metal web 20 partly in the circulating aqueous solution 27. When the metal web 20 passes through the liquid solution, both surfaces of the metal web 20 are treated with the aqueous solution 27 with the occurrence, for example, of a desired chemical reaction.

A specific gravity sensor 28, which is disposed near the bottom of the treating tank 23, continuously monitors the specific gravity of the circulating aqueous solution 27. An indicator 29 displays the specific gravity detected by the specific gravity sensor 28. A comparator circuit 25 compares the detected specific gravity with a reference specific gravity set by a reference specific gravity setting unit 30 and provides a CPU 34 with an output indicating any difference of the two specific gravities.

A line speed detector 31 continuously monitors the metal web 20 to determine its linear speed and outputs an appropriate electric signal (which is hereinafter referred to as a line speed signal (LSS)). A width detector 32 continuously monitors the metal web 20 to determine its width and outputs an appropriate electric signal (which is hereinafter referred to as a width signal (WS)). A data input unit 33 provides a data signal indicating the necessary specific characteristics such as the kind of web 20, etc. These signals are all sent to the CPU 34.

Based on the linear speed, the width and/or other physical parameters of the metal web 20 and the deviation of the specific gravity of the circulating treating solution 27 from the reference specific gravity, the CPU 34 controls the frequency with which pulses are generated thereby.

A replenishing unit 36 adds a predetermined quantity of liquid additive to replenish aqueous solution 38 in a reservoir 37 each time a pulse is applied thereto by the CPU 34. The aqueous solution 38 is thoroughly mixed with the added liquid in a well-known manner. The aqueous solution 38 is pumped into the treating tank 23 by a pump 39. To keep the volume of the circulating aqueous solution 27 in the treating tank 23 constant, the circulating aqueous solution 27 is recirculated from the treating tank 23 at an appropriate rate having regard for the rate of replenishment and the delivery rate of the aqueous solution 38 into the treating tank 23. This recirculation and replenishment can be carried out in any manner well known in the chemical processing art.

The CPU 34 provides a pulse, which pulse has a pulse width $\Delta T$ defined between a time $t_o$ at which the pulse begins and a time $t_1$ at which the pulse ends. The pulse width $\Delta T$ is a measurement of how long the replenishing unit 36 is actuated. The pulse width $\Delta T$ is to be kept constant if the pressure P of the liquid additive is constant and to vary in inverse proportion to the value $P^{\frac{1}{2}}$ if the pressure fluctuates.

The current period $T_C$ at which the control pulse CP is provided is given as follows:

$$T_C = T_S - T_D$$

where
 $T_S$ is a fundamental period; and
 $T_D$ is a compensatory period depending on the detected specific gravity of the circulating aqueous solution 27. These periods $T_C$, $T_S$ and $T_D$ are given by the following equations (1), (2) and (3), respectively:

$$T_S = aW - bV + c \quad (1)$$

$$T_D = d(D - D_s) + e \quad (2)$$

$$T_C = T_S - T_D = aW - bV - d(D - D_s) + c - e \quad (3)$$

where
 W is the width of the metal web;
 V is the detected linear speed of the metal web;
 D is the detected specific gravity of the circulating aqueous solution;
 $D_s$ is the reference specific gravity; and
 a, b, c, d and e are constants according to the properties of the web.

These constants a, b, c, d and e are experimentally obtained and their values are stored in the CPU 34.

If any one of the line speed V and the width W of the web 20 and the web 20 itself (the constants a to d) changes, the fundamental period $T_S$, and accordingly the current period $T_C$ and the compensatory period $T_D$, change according to the equations (1) and (3). That is, if the line speed V intermittently changes while no change of the specific gravity of the circulating aqueous solution 27 takes place, the current period $T_C$ immediately changes correspondingly to the changed fundamental period $T_S$ by feedforward control. By means of this feedforward control, the replenishing unit 36 regulates the rate of flow at which the liquid additive is delivered to the aqueous solution 38. Furthermore, feedback control is realized by a closed loop consisting of the steps of detecting the specific gravity by the specific gravity sensor 28, calculating the deviation of the specific gravity of the circulating aqueous solution from the reference specific gravity, changing the compensatory frequency $T_D$ depending on the calculated deviation of specific gravity, supplying liquid additive to the aqueous solution, and changing the specific gravity of aqueous solution 28, looped in this order. In the combination of the feedforward and feedback controls, the time necessary to adjust or change the characteristics, such as the specific gravity, conductivity or the like, of a circulating aqueous solution, is shortened by lengthening or shortening the period $T_C$ at which the control pulse CP is provided.

Although the present invention has been fully described by way of the preferred embodiment thereof with reference to the accompanying drawings, the possibility of various changes and modifications will be apparent to those skilled in the art. Therefore, unless otherwise these changes and modifications depart from the scope of the present invention, they should be construed as being included therein.

What is claimed is:

1. A method for controlling the characteristics of an aqueous solution for treating the surface of a continuously moving web travelling through said solution, said solution having a property with a detectable value, said method comprising the steps of:
 detecting physical parameters of said moving web;
 effecting a feedforward control to change the value of said property of said solution at a fundamental period of time, said fundamental period depending upon said detected physical parameters of said moving web;

detecting a change in the value of said property of said solution under said feedforward control; and effecting a feedback control for changing said fundamental period of said feedforward control in accordance with the difference between said detected value of said property and a predetermined value of said property to which said solution is to be controlled.

2. A method as defined in claim 1, wherein a said physical parameter of said web is the linear speed at which said web is continuously driven.

3. A method as defined in claim 1, wherein a said physical parameter of said moving web is the width of said web.

4. A method as defined in claim 1, wherein said physical parameters of said moving web are the linear speed at which said web is continuously driven and the width of said web.

5. A method as defined in claim 1, wherein said property of said solution is its specific gravity.

6. A method as defined in claim 1, wherein said feedforward control comprises adding material to said solution.

7. A method as defined in claim 1, wherein said web is immersed in said solution.

8. A method for controlling the characteristics of an aqueous solution for treating the surface of a continuously moving web travelling through said solution, said solution having a property with a detectable value, said method comprising the steps of:

detecting at least one physical parameter of said moving web;

adding a liquid additive at a controlled rate of flow to said aqueous solution so as to change the property of said solution, by a feedforward control which is effected at a fundamental period, said fundamental period depending upon said detected physical parameter of said moving web;

maintaining a body of said solution at a constant level;

detecting the value of said property of said aqueous solution; and changing said fundamental period, by a feedback control, in accordance with a difference between said detected value of said property of said aqueous solution and a predetermined value of said property to which said aqueous solution is to be controlled.

9. A method as defined in claim 8, wherein said at least one physical parameter of said moving web is a speed at which said web is continuously driven.

10. A method as defined in claim 8, wherein said at least one physical parameter of said moving web is a width of said web.

11. A method as defined in claim 8, wherein said at least one physical parameter of said moving web are a speed at which said web is continuously driven and a width of said web.

12. A method as defined in claim 8, wherein said property of said solution is a specific gravity.

13. A method as defined in claim 8, wherein said web is immersed in said body of said solution.

* * * * *